(12) United States Patent
Lan et al.

(10) Patent No.: US 12,040,268 B2
(45) Date of Patent: Jul. 16, 2024

(54) THIN FILM RESISTOR (TFR) DEVICE STRUCTURE FOR HIGH PERFORMANCE RADIO FREQUENCY (RF) FILTER DESIGN

(71) Applicant: QUALCOMM Incorporated, San Diego, CA (US)

(72) Inventors: Je-Hsiung Lan, San Diego, CA (US); Jonghae Kim, San Diego, CA (US); Kai Liu, Phoenix, AZ (US); Nosun Park, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 232 days.

(21) Appl. No.: 17/830,196

(22) Filed: Jun. 1, 2022

(65) Prior Publication Data

US 2023/0395491 A1 Dec. 7, 2023

(51) Int. Cl.
*H01L 23/522* (2006.01)
*H01C 7/00* (2006.01)
*H01C 17/075* (2006.01)
*H01L 23/66* (2006.01)
*H01L 49/02* (2006.01)

(52) U.S. Cl.
CPC ......... *H01L 23/5228* (2013.01); *H01C 7/006* (2013.01); *H01C 17/075* (2013.01); *H01L 23/5226* (2013.01); *H01L 23/66* (2013.01); *H01L 28/10* (2013.01); *H01L 28/24* (2013.01); *H01L 2223/6672* (2013.01)

(58) Field of Classification Search
CPC . H01L 23/5228; H01L 23/66; H01L 23/5226; H01L 28/10; H01L 28/24; H01C 7/006; H01C 17/075
See application file for complete search history.

(56) References Cited

U.S. PATENT DOCUMENTS 6,777,777 B1  8/2004  Kar-Roy et al.
7,306,986 B2  12/2007  Remmel et al.
(Continued)

FOREIGN PATENT DOCUMENTS

WO     2021173197 A1    9/2021

OTHER PUBLICATIONS

International Search Report and Written Opinion—PCT/US2023/018347—ISA/EPO—Jul. 6, 2023.

*Primary Examiner* — Omar F Mojaddedi
(74) *Attorney, Agent, or Firm* — Seyfarth Shaw LLP

(57) ABSTRACT

An integrated circuit (IC) includes a substrate and a thin film resistor (TFR) device structure. The TFR device structure includes a first portion of a first metallization layer and a second portion of the first metallization layer on the substrate. The TFR device structure also includes a first portion of a dielectric layer on the first portion of the first metallization layer and a second portion of the dielectric layer on the second portion of the first metallization layer. The TFR device structure further includes a first portion of a second metallization layer on the first portion of the dielectric layer and a second portion of the second metallization layer on the second portion of the dielectric layer. The TFR device structure also includes a first portion of a third metallization layer coupling the first portion of the second metallization layer to the second portion of the second metallization layer.

20 Claims, 14 Drawing Sheets

(56) References Cited

U.S. PATENT DOCUMENTS

| | | | |
|---|---|---|---|
| 2004/0241951 A1* | 12/2004 | Amadon | H01C 7/06 |
| | | | 438/384 |
| 2015/0108607 A1* | 4/2015 | Chen | H01L 23/5228 |
| | | | 257/533 |
| 2021/0098363 A1* | 4/2021 | Linewih | H01L 28/60 |
| 2022/0302018 A1* | 9/2022 | Leng | H01L 28/20 |
| 2022/0310513 A1* | 9/2022 | Bak | H01L 23/5226 |
| 2023/0081749 A1* | 3/2023 | Leng | H01L 28/20 |
| | | | 257/532 |

* cited by examiner

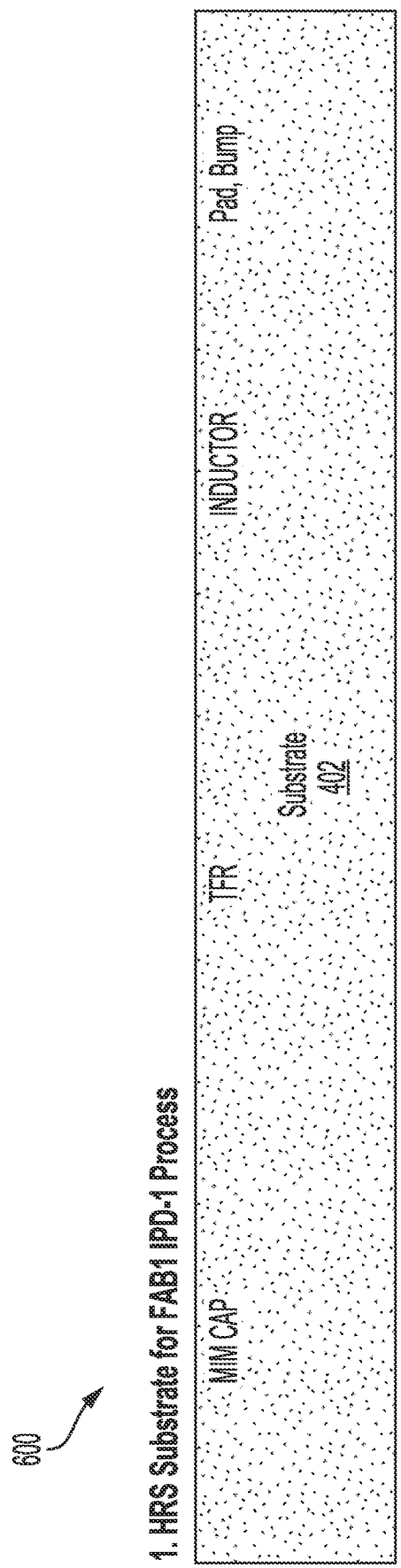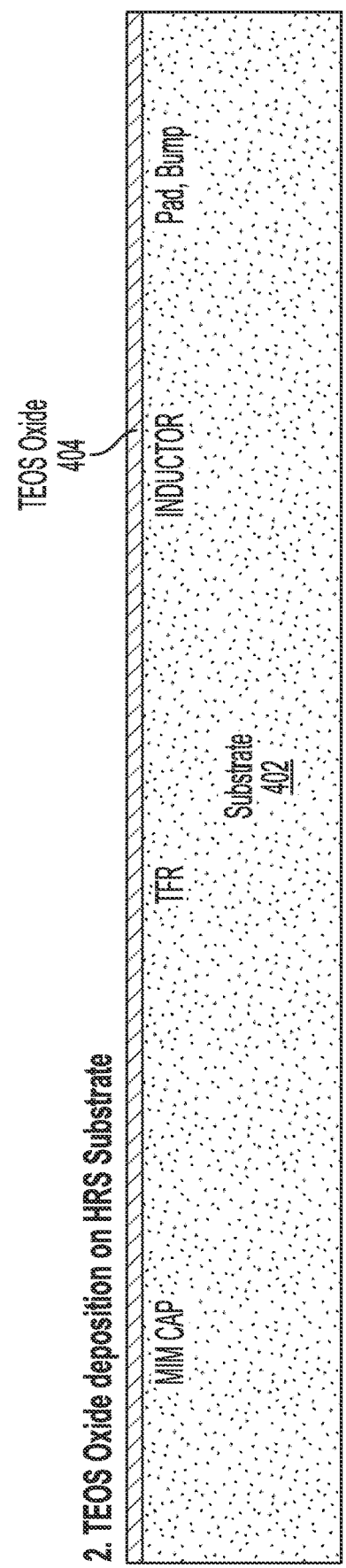

THIN FILM RESISTOR (TFR) DEVICE STRUCTURE FOR HIGH PERFORMANCE RADIO FREQUENCY (RF) FILTER DESIGN

BACKGROUND

Field

Aspects of the present disclosure relate to semiconductor devices and integrated passive devices and, more particularly, to a thin film resistor (TFR) device structure for high performance radio frequency (RF) filter design.

Background

Wireless communications devices incorporate radio frequency (RF) modules that facilitate the communication and features users expect. As wireless systems become more prevalent and include more capabilities, the chips have become more complex to produce. Fifth generation (5G)/sixth generation (6G) new radio (NR) wireless communications devices incorporate the latest generation of electronic dies that pack many features and devices into modules that are smaller and with increasingly smaller interconnections. As these modules increase in density, resistors are important for combining and/or distributing RF power.

Design challenges for mobile radio frequency (RF) chips, such as mobile RF transceivers, include analog/RF performance considerations, including mismatch, noise and other performance considerations. The design of these mobile RF transceivers includes the use of passive devices, such as resistors for example, to perform filtering and coupling. These resistors are integrated into high power, system on chip devices, such as application processors and graphics processors.

In practice, the passive devices of a mobile RF transceiver may involve high performance resistor components. For example, analog integrated circuits use various types of passive devices, such as resistors. The use of resistors may enable high performance power combiner/divider filters that use resistor components to combine/distribute RF power. Unfortunately, conventional resistor components fail to achieve expected isolation due to parasitic capacitive coupling between electrodes of the resistor components. A thin film resistor (TFR) device structure for providing expected isolation to enable 5G/6G front-end applications is desired.

SUMMARY

An integrated circuit (IC) includes a substrate and a thin film resistor (TFR) device structure. The TFR device structure includes a first portion of a first metallization layer and a second portion of the first metallization layer on the substrate. The TFR device structure also includes a first portion of a dielectric layer on the first portion of the first metallization layer and a second portion of the dielectric layer on the second portion of the first metallization layer. The TFR device structure further includes a first portion of a second metallization layer on the first portion of the dielectric layer and a second portion of the second metallization layer on the second portion of the dielectric layer. The TFR device structure also includes a first portion of a third metallization layer coupling the first portion of the second metallization layer to the second portion of the second metallization layer.

A method for fabricating a thin film resistor (TFR) device structure is described. The method includes forming a first portion of a first metallization layer and a second portion of the first metallization layer on a substrate. The method also includes forming a first portion of a dielectric layer on the first portion of the first metallization layer and a second portion of the dielectric layer on the second portion of the first metallization layer. The method further includes forming a first portion of a second metallization layer on the first portion of the dielectric layer and a second portion of the second metallization layer on the second portion of the dielectric layer. The method also includes forming a first portion of a third metallization layer to couple the first portion of the second metallization layer to the second portion of the second metallization layer.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 6A to 6J are diagrams illustrating a process of fabricating a radio frequency integrated circuit (RFIC) chip, including a metal-insulator-metal (MIM) capacitor, a thin film resistor (TFR) device structure, and an inductor, according to aspects of the present disclosure.

DETAILED DESCRIPTION

Figure 1:
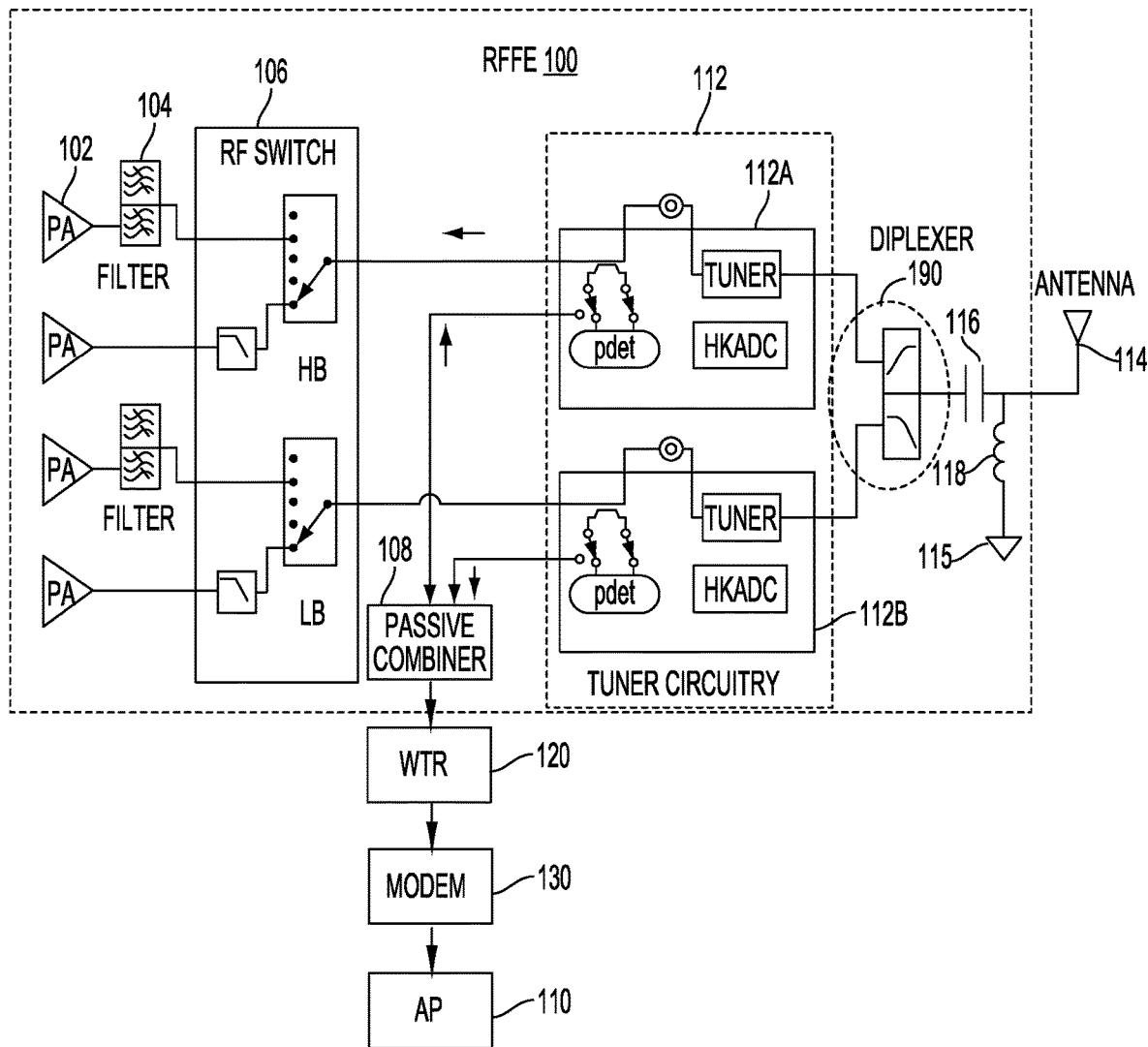
FIG. 1 is a schematic diagram of a radio frequency front-end (RFFE) module employing an integrated passive device (IPD) filter.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile radio frequency (RF) chips (e.g., mobile RF transceivers) have migrated to a deep sub-micron process node due to cost and power consumption considerations. Designing mobile RF transceivers is complicated by added circuit functions for supporting communications enhancements, such as fifth generation (5G) new radio (NR)/sixth generation (6G) communications systems. Further design challenges for mobile RF transceivers include using passive devices, which directly affect analog RF performance considerations, including mismatch, noise, and other performance considerations.

Passive devices in mobile radio frequency (RF) transceivers may include high performance resistor, capacitor, and inductor components. For example, analog integrated circuits use various types of passive devices, such as integrated capacitors, integrated inductors, and resistor components. Integrated capacitors may include metal-oxide-semiconductor (MOS) capacitors, p-n junction capacitors, metal-insulator-metal (MIM) capacitors, poly-to-poly capacitors, metal-oxide-metal (MOM) capacitors, and other like capacitor structures. An inductor is an example of an electrical device used to temporarily store energy in a magnetic field within a wire coil according to an inductance value. A resistor is a passive two-terminal electrical component that implements electrical resistance as a circuit element, which may be used to reduce current flow, adjust signal levels, divide voltages, bias active elements, and terminate transmission lines. For example, the design of mobile RF transceivers includes the use of RF filters having resistors, inductors, and capacitors to meet bandwidth specifications.

A 5G/6G radio frequency front-end (RFFE) module may include a combiner/divider filter and/or directional couplers including, resistor components, MIM capacitors, and inductors. These 5G/6G RF front-end applications specify resistor components to combine/distribute the RF power to enable the high performance power of combiner/divider filters. Unfortunately, a thin film resistor (TFR) available using the current integrated passive device (IPD) foundry process fails to achieve an expected isolation due to parasitic capacitance coupling of electrodes of the TFR. Without the option to modify the foundry IPD process flow, it is impossible to implement and realize the TFR device for the power combiner/divider filters. Therefore, a TFR device structure with design technique/optimization to resolve these issues is desired.

Various aspects of the present disclosure provide a TFR device structure for an RF filter. The process flow for fabrication of the TFR device structure for an RF filter may include front-end-of-line (FEOL) processes, middle-of-line (MOL) processes, and back-end-of-line (BEOL) processes. It will be understood that the term "layer" includes film and is not construed as indicating a vertical or horizontal thickness unless otherwise stated. As described, the term "substrate" may refer to a substrate of a diced wafer or may refer to a substrate of a wafer that is not diced. Similarly, the terms chip and die may be used interchangeably.

As described, the back-end-of-line (BEOL) interconnect layers may refer to the conductive interconnect layers (e.g., a first interconnect layer (M1) or metal one M1, metal two (M2), metal three (M3), metal four (M4), etc.) for electrically coupling to front-end-of-line (FEOL) active devices of an integrated circuit. The various BEOL interconnect layers are formed at corresponding BEOL interconnect layers, in which lower BEOL interconnect layers use thinner metal layers relative to upper BEOL interconnect levels. The BEOL interconnect layers may electrically couple to middle-of-line (MOL) interconnect layers, for example, to connect M1 to an oxide diffusion (OD) layer of an integrated circuit. The MOL interconnect layer may include a zero interconnect layer (M0) for connecting M1 to an active device layer of an integrated circuit. A BEOL first via (V2) may connect M2 to M3 or others of the BEOL interconnect layers.

Aspects of the present disclosure are directed to a thin film resistor (TFR) device structure to implement an RF filter, such as a power combiner/divider filter or directional coupler. In some aspects of the present disclosure, the TFR device structure includes a split first metallization layer (e.g., M1). The TFR device structure also includes a dielectric layer portion on the split portions of the M1 metallization layer. In some aspects of the present disclosure, the TFR device structure includes a split M2 metallization layer on the respective portions of the dielectric layer. In some aspects of the present disclosure, the M1 and M2 metallization layers are split to provide expected isolation specified by the TFR device structure. This configuration of the TFR device structure can match an expected radio frequency (RF) response, and also meet the power combiner/divider filter design target specifications.

FIG. 1 is a schematic diagram of a radio frequency front-end (RFFE) module 100 employing a filter 104 (e.g., an RF filter implemented with a TFR device structure). The RFFE module 100 includes power amplifiers 102, filter 104, and a radio frequency (RF) switch module 106. The power amplifiers 102 amplify signal(s) to a certain power level for transmission. The filter 104 filters the input/output signals according to a variety of different parameters, including frequency, insertion loss, rejection, or other like parameters. In addition, the RF switch module 106 may select certain portions of the input signals to pass on to the rest of the RFFE module 100.

The radio frequency front-end (RFFE) module 100 also includes tuner circuitry 112 (e.g., first tuner circuitry 112A and second tuner circuitry 112B), the second diplexer 190, the capacitor 116, an inductor 118, a ground terminal 115, and an antenna 114. The tuner circuitry 112 (e.g., the first tuner circuitry 112A and the second tuner circuitry 112B) includes components such as a tuner, a portable data entry terminal (PDET), and a housekeeping analog-to-digital converter (HKADC). The tuner circuitry 112 may perform impedance tuning (e.g., a voltage standing wave ratio (VSWR) optimization) for the antenna 114. The RFFE module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 110.

As shown in FIG. 1, the second diplexer 190 is between the tuner component of the tuner circuitry 112 and the capacitor 116, the inductor 118, and the antenna 114. The second diplexer 190 may be placed between the antenna 114 and the tuner circuitry 112 to provide high system performance from the radio frequency front-end (RFFE) module 100 to a chipset including the wireless transceiver 120, the modem 130, and the application processor 110. The second diplexer 190 also performs frequency domain multiplexing on both high band frequencies and low band frequencies. After the second diplexer 190 performs its frequency multiplexing functions on the input signals, the output of the second diplexer 190 is fed to an optional inductor/capacitor (LC) network including the capacitor 116 and the inductor 118. The LC network may provide extra impedance matching components for the antenna 114, when desired. Then, a signal with the particular frequency is transmitted or received by the antenna 114. Although a single capacitor and inductor are shown, multiple components are also contemplated.

Figure 2:
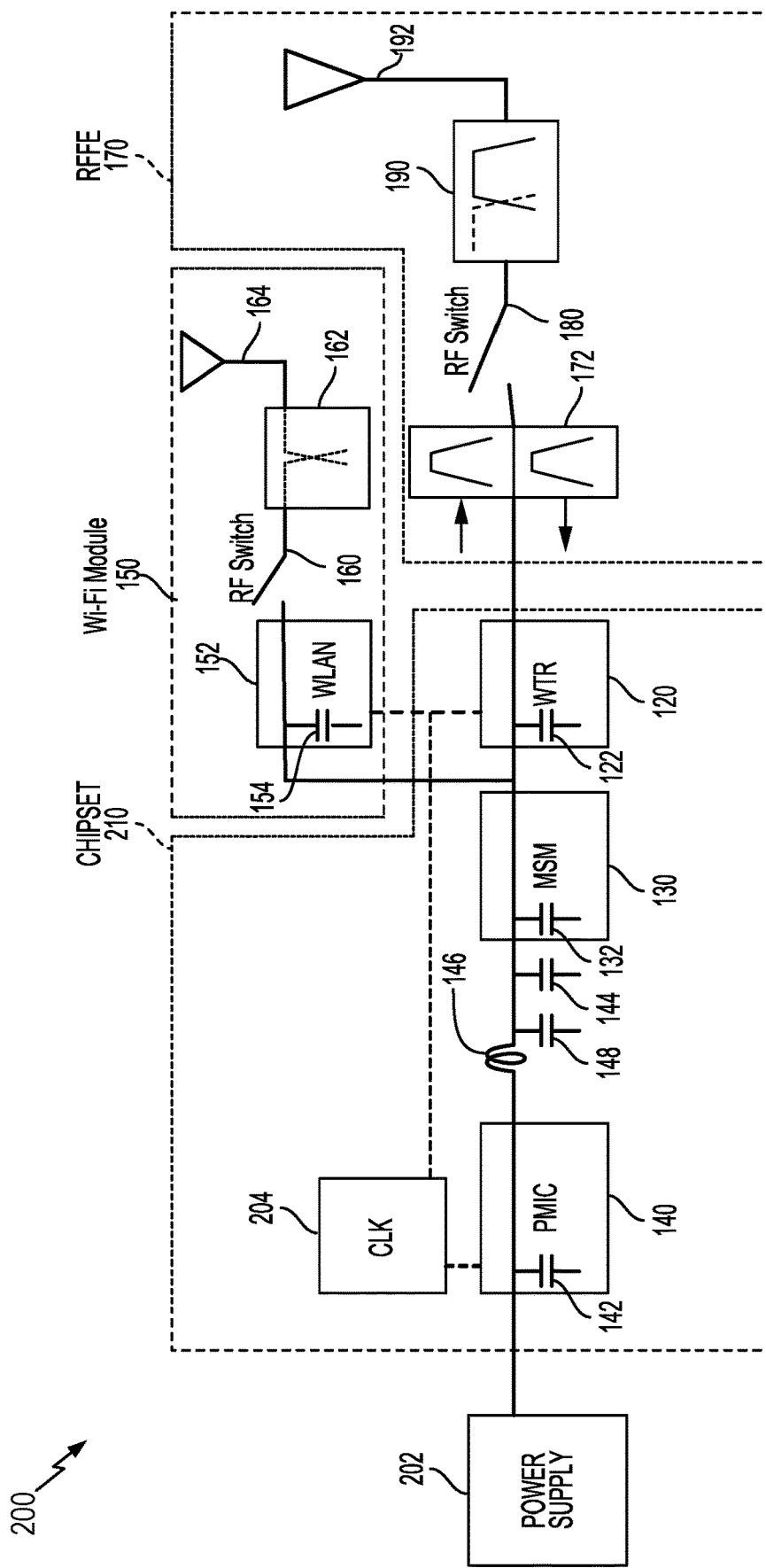
FIG. 2 is a schematic diagram of a radio frequency front-end (RFFE) module employing an integrated passive device (IPD) filter for a chipset.

FIG. 2 is a schematic diagram of a radio frequency integrated circuit (RFIC) chip 200, having a wireless local area network (WLAN) (e.g., Wi-Fi) module 150 and a radio frequency front-end (RFFE) module 170 for a chipset 210. The Wi-Fi module 150 includes a first diplexer 162 communicably coupling an antenna 164 to a WLAN module 152. A first RF switch 160 communicably couples the first diplexer 162 to the WLAN module 152. The RFFE module 170 includes a second diplexer 190 communicably coupling an antenna 192 to a wireless transceiver (WTR) 120 through a filter 172 (e.g., an RF filter implemented with a TFR device structure). A second RF switch 180 communicably couples the second diplexer 190 to the filter 172.

The WTR 120 and the WLAN module 152 of the Wi-Fi module 150 are coupled to a modem (mobile station modem (MSM), e.g., baseband modem) 130 that is powered by a power supply 202 through a power management integrated circuit (PMIC) 140. The chipset 210 also includes capacitors 144 and 148, as well as an inductor(s) 146 to provide signal integrity. The PMIC 140, the modem 130, the WTR 120, and the WLAN module 152 each include capacitors (e.g., 142, 132, 122, and 154) and operate according to a clock 204. In addition, the inductor 146 couples the modem 130 to the PMIC 140. The geometry and arrangement of the various inductor and capacitor components in the RFIC) chip 200 may reduce the electromagnetic coupling between the components. The design of the RFFE module 170 includes the filter 172, which may be an RF filter implemented with a TFR device structure, for example, as shown in FIG. 3, according to aspects of the present disclosure.

Figure 3:
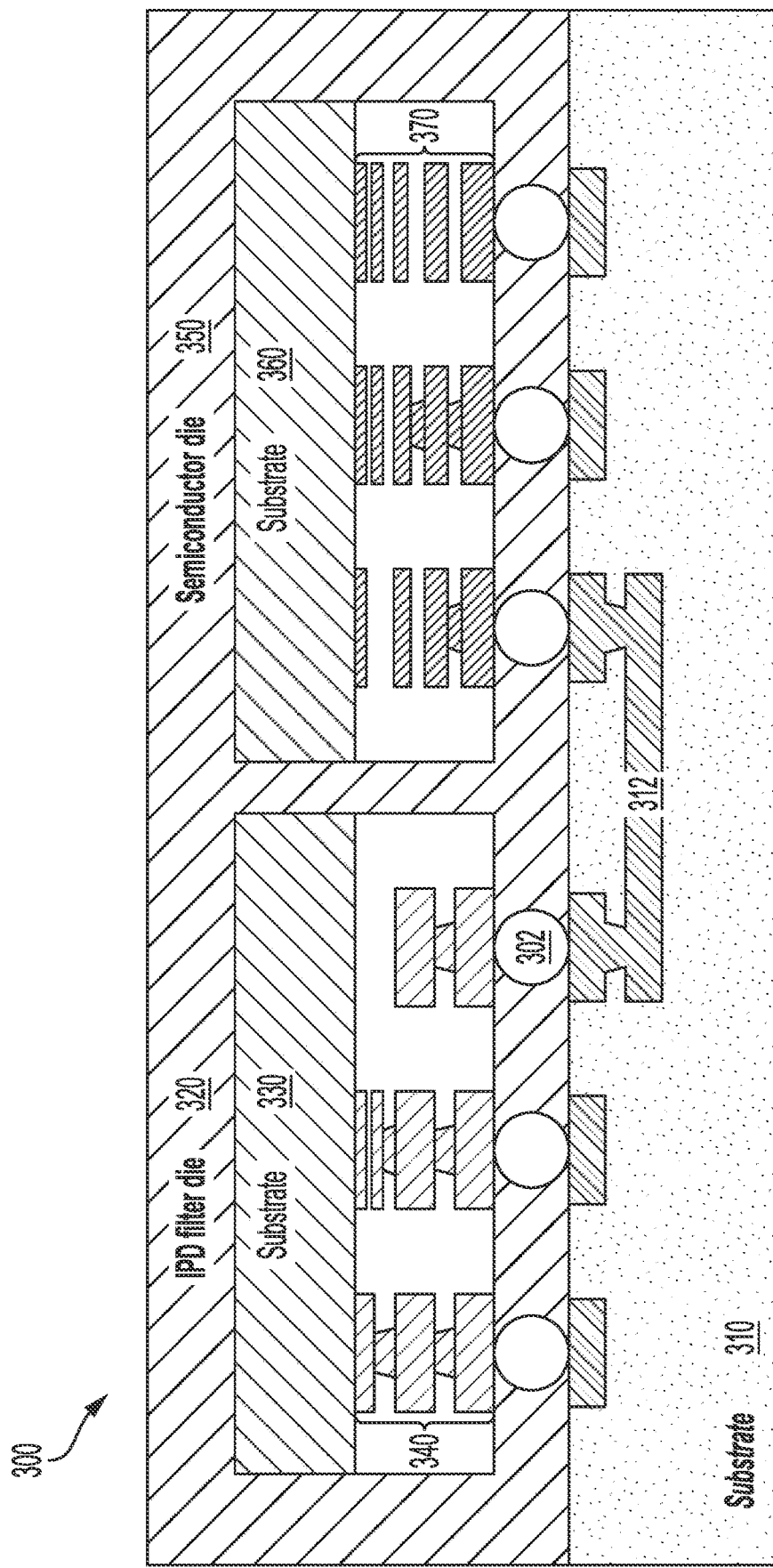
FIG. 3 is a block diagram illustrating a cross-sectional view of a radio frequency front-end (RFFE) module including a semiconductor die and an integrated passive device (IPD) filter die, in accordance with aspects of the present disclosure.

FIG. 3 is a block diagram illustrating a cross-sectional view of a radio frequency front-end (RFFE) module 300, including a semiconductor die and an integrated passive device (IPD) filter die, in accordance with aspects of the present disclosure. In this example, the RFFE module 300 includes a semiconductor die 350 and an IPD filter die 320 supported by a substrate 310. The semiconductor die 350 may be an active die having a semiconductor substrate 360 (e.g., an active silicon substrate) coupled to package balls 302 through back-end-of-line (BEOL) layers 370. The BEOL layers 370 include multiple BEOL metallization layers (M1, M2, M3, . . . , Mn) on the semiconductor substrate 360 (e.g., a diced silicon wafer). A redistribution layer 312 is coupled to the package balls 302.

The IPD filter die 320 includes a substrate 330 (e.g., a passive substrate) coupled to the package balls 302 through back-end-of-line (BEOL) layers 340. The redistribution layer 312 is coupled to the IPD filter die 320 through the package balls 302. In some aspects of the present disclosure, the substrate 330 is composed of glass, and the IPD filter die 320 is a glass-substrate integrated passive device (GIPD) filter die. The IPD filter die 320 may implement a fifth generation (5G) new radio (NR)/sixth generation (6G) power combiner/divider filter or directional coupler.

The RFFE module 300 may include a power combiner/divider filter including resistor components, MIM capacitors, and inductors. The RFFE module 300 may specify resistor components to combine/distribute the RF power to enable the high performance power combiner/divider filters. Unfortunately, a thin film resistor (TFR) resulting from the current IPD foundry process fails to achieve an expected isolation due to parasitic capacitance coupling between the electrodes of the TFR device. Without the option to modify the foundry IPD process flow, it is impossible to implement and realize a TFR device for meeting the specifications of the power combiner/divider filters. In some aspects of the present disclosure, the IPD filter die 320 includes a TFR device structure for an RF filter, as further illustrated in FIGS. 4A and 4B.

Figure 4A:
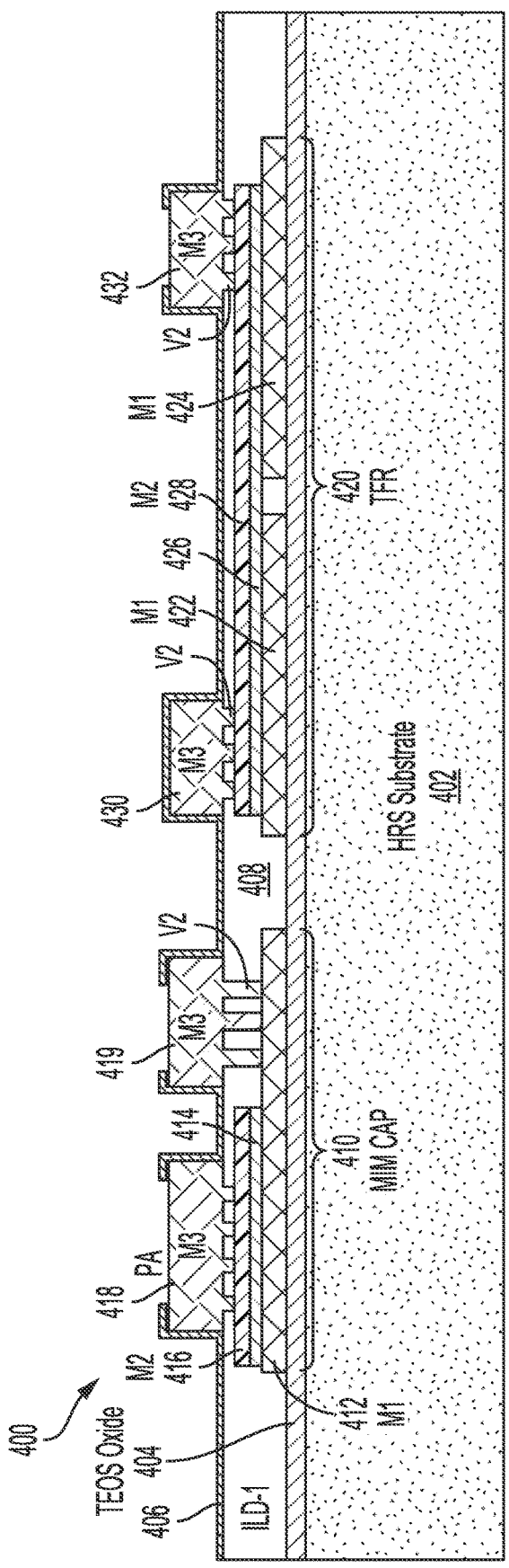
FIGS. 4A and 4B are diagrams illustrating a radio frequency integrated circuit (RFIC) chip including a metal-insulator-metal (MIM) capacitor and a thin film resistor (TFR) device for a radio frequency (RF) filter, according to aspects of the present disclosure.
Figure 4B:
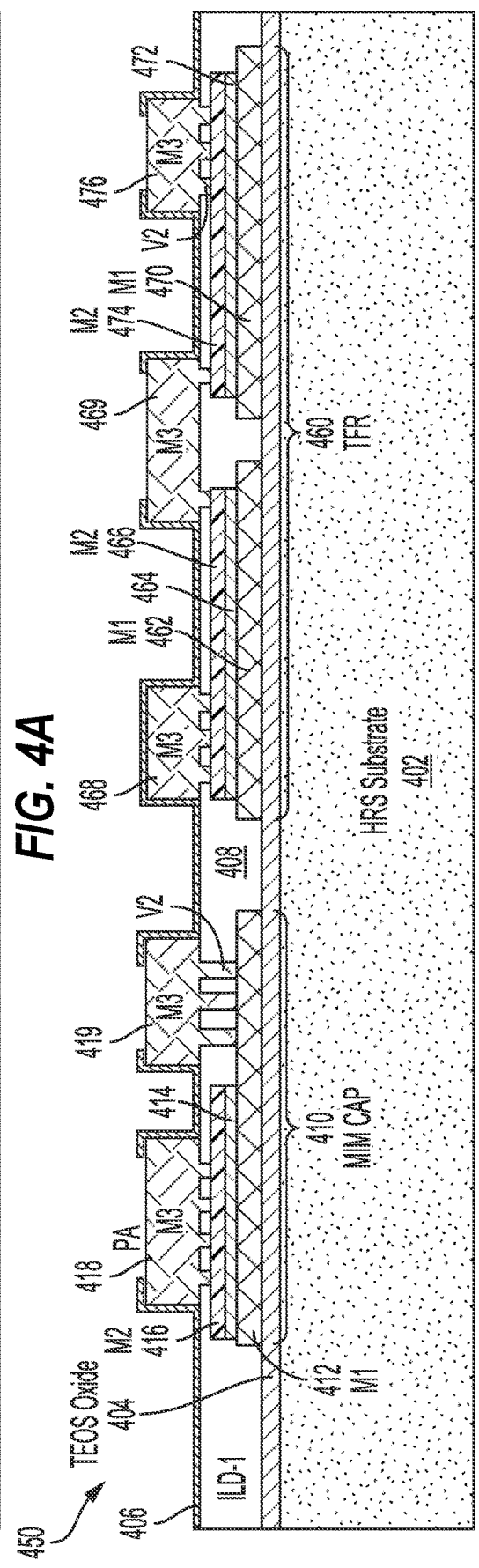

FIGS. 4A and 4B are block diagrams illustrating a radio frequency integrated circuit (RFIC) chip including a metal-insulator-metal (MIM) capacitor and a thin film resistor (TFR) device for a radio frequency (RF) filter, according to aspects of the present disclosure. FIG. 4A illustrates an RFIC chip 400, including a substrate 402 having an oxide layer 404 (e.g., tetraethyl orthosilicate (TEOS) oxide) on a surface of the substrate 402. In some aspects of the present disclosure, the RFIC chip 400 includes a metal-insulator-metal (MIM) capacitor 410 and a thin film resistor (TFR) device structure 420 on the oxide layer 404.

In some aspects of the present disclosure, the TFR device structure 420 includes a split first metallization layer (e.g., M1), including a first portion 422 of the M1 metallization layer and a second portion 424 of the M1 metallization layer on the surface of the oxide layer 404. The TFR device structure 420 also includes a dielectric layer 426 on the first portion 422 and the second portion 424 of the M1 metallization layer. The TFR device structure 420 also includes an M2 metallization layer 428 on the dielectric layer 426. The M2 metallization layer 428 may be composed of a TFR layer, such as titanium nitride (TiN), tantalum nitride (TaN), nickel chromium (NiCr), or other like conductive material for a resistor. In addition, a first portion 430 and a second portion 432 of a third metallization layer (e.g., an M3 metallization layer) are coupled to the M2 metallization layer 428 through vias V2 to complete formation of the TFR device structure 420.

In this example, the MIM capacitor 410 includes a first plate 412 composed of the M1 metallization layer on the surface of the oxide layer 404. The MIM capacitor 410 also includes a MIM insulator layer 414 on the first plate 412 of the MIM capacitor 410. In addition, a second plate 416 of the MIM capacitor 410 is composed of the M2 metallization layer on the MIM insulator layer 414. In addition, a first portion 418 and a second portion 419 of an M3 metallization layer are coupled to the second plate 416 and the first plate 412 through vias V2 in a first interlayer dielectric (ILD) layer 408 to complete formation of the MIM capacitor 410. A passivation layer 406 is provided on the portions (e.g., 418, 419, 430, and 432) of the M3 metallization layer and the first ILD layer 408, FIG. 4B illustrates an RFIC chip 450, including the substrate 402 having the oxide layer 404 (e.g., tetraethyl orthosilicate (TEOS) oxide) on the surface of the substrate 402. In some aspects of the present disclosure, the RFIC chip 450 includes the MIM capacitor 410 and a TFR device structure 460 on the oxide layer 404. In some aspects of the present disclosure, the TFR device structure 460 also includes a split M1 metallization layer, including a first portion 462 of an M1 metallization layer and a second portion 470 of the M1 metallization layer on the surface of the oxide layer 404. The TFR device structure 460 includes a first portion 464 of a dielectric layer on the first portion 462 of the M1 metallization layer and a second portion 472 of the dielectric layer on the second portion 470 of the M1 metallization layer.

In some aspects of the present disclosure, the TFR device structure 460 includes a split M2 metallization layer. In these aspects of the present disclosure, the TFR device structure 460 includes a first portion 464 of a dielectric layer on the first portion 462 of the M1 metallization layer and a second portion 472 of the dielectric layer on the second portion 470 of the M1 metallization layer. The TFR device structure 460 further includes a first portion 466 of the M2 metallization layer on the first portion 464 of the dielectric layer and a second portion 474 of the M2 metallization layer on the second portion 472 of the dielectric layer. The M2 metallization layer may be composed of a TFR layer, such as titanium nitride (TiN), tantalum nitride (TaN), nickel chromium (NiCr), or other like conductive material for a resistor. In these aspects of the present disclosure, a second portion 469 of the M3 metallization layer couples the first portion 466 of the M2 metallization layer to the second portion 474 of the M2 metallization layer. In addition, a first portion 468 and a third portion 476 of the M3 metallization layer are coupled to the first portion 466 and the second portion 474 of the M2 metallization layer through vias V2. The passivation layer 406 is also provided on the portions (e.g., 418, 419, 468, 469, and 476) of the M3 metallization layer and the first ILD layer 408 to complete formation of the TFR device structure 460.

Figure 5A:
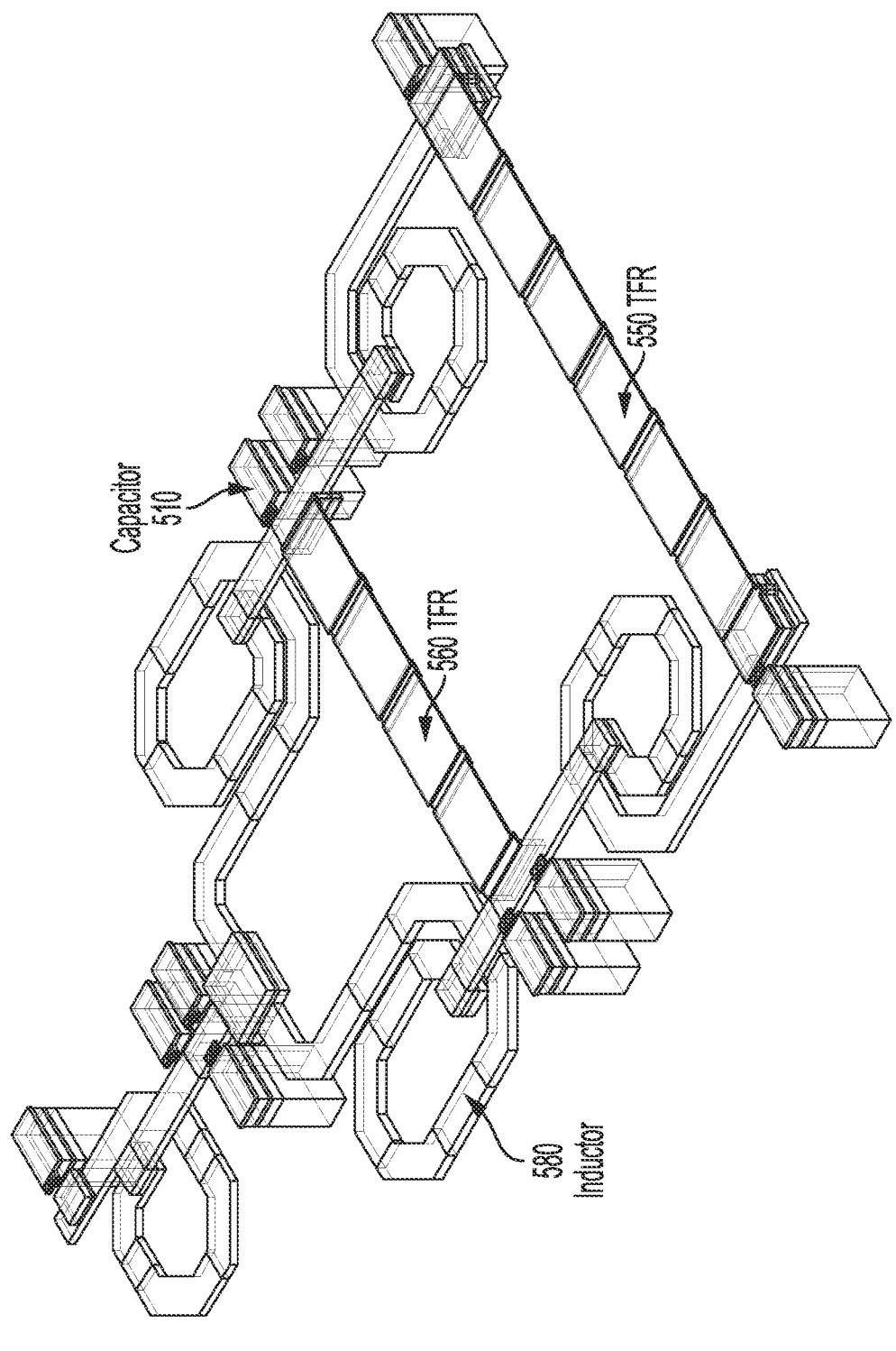
FIGS. 5A-5D are schematic diagrams of a power combiner/divider filter having a thin film resistor (TFR) device structure, according to aspects of the present disclosure.
Figure 5B:
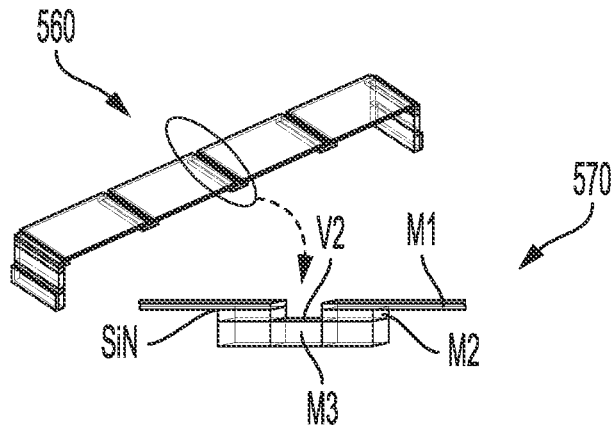

FIGS. 5A-5D are schematic diagrams of a power combiner/divider filter having a thin film resistor (TFR) device structure, according to aspects of the present disclosure. FIG. 5A illustrates a schematic diagram of a power combiner/divider filter 500 having metal-insulator-metal (MIM) capacitors 510, thin film resistor (TFR) device structures 550, and inductors 580. FIG. 5B illustrates a perspective view and an exploded view 570 of a first TFR device structure 560, according as aspects of the present disclosure. As shown in the exploded view 570, a first TFR device structure 560 includes the M3 metallization layer joining a first portion and a second portion of the M1 metallization layer, including dielectric layers (e.g., silicon nitride (SiN)), M2 metallization layers, and vias V2.

Figure 5C:
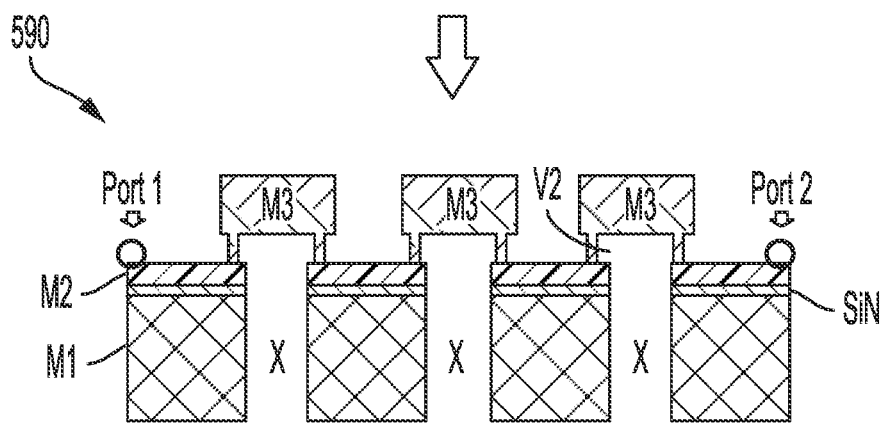
Figure 5D:
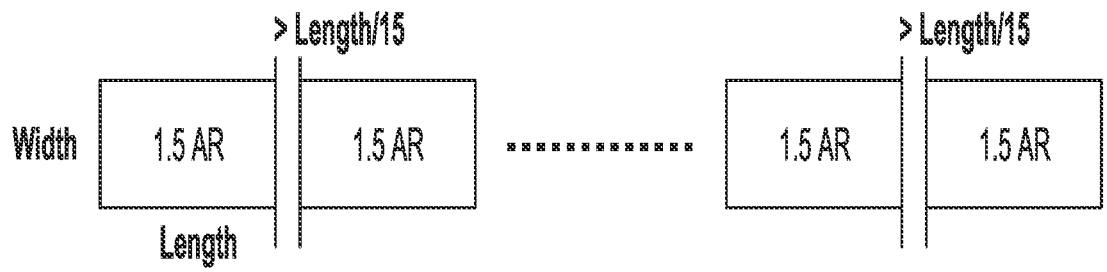

FIG. 5C illustrates a cross-sectional view 590 of the first TFR device structure 560, including a first port (e.g., Port 1) and a second port (e.g., Port 2). The cross-sectional view 590 of the first TFR device structure 560 further illustrates the split bottom electrodes (M1) floated underneath the split top electrodes (M2). FIG. 5D illustrates a top view of the first TFR device structure 560. In this configuration, an aspect ratio (AR) between the length and the width of the unit cells of the first TFR device structure 560 (e.g., M1 metallization layer portions) is approximately 1.5. In addition, a space between the portions of the M1 metallization layer is approximately one fifteenth ($1/15$) of the length. This configuration is available through a low-cost advanced integrated passive device (IPD) process to implement a high performance power combiner (PC) with an expected isolation that conventional TFR designs fail to realize. This first TFR device structure 560 can match an expected radio frequency (RF) response, and also meet the power combiner filter design target specifications. Formation of a TFR device structure is illustrated in FIGS. 6A-6J.

Figure 6C:
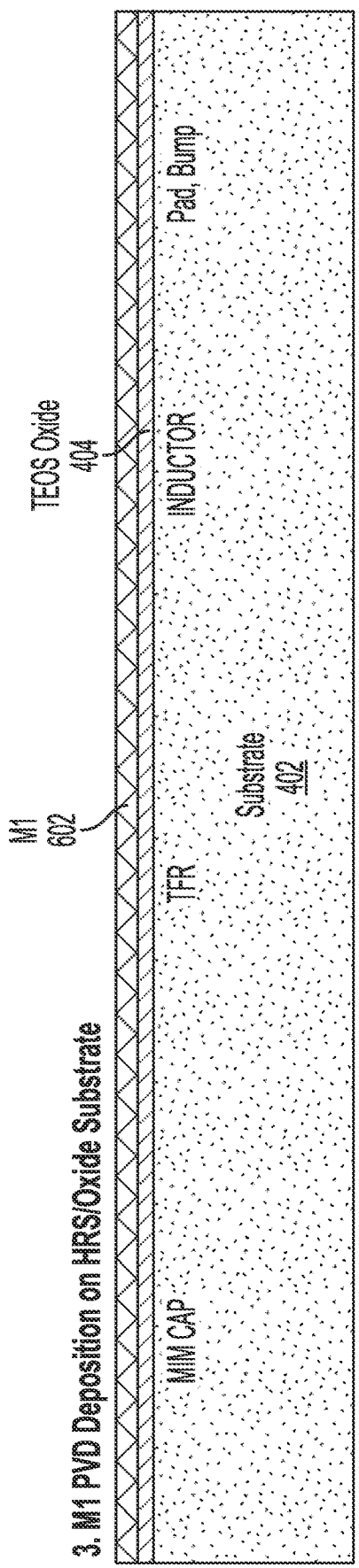

FIGS. 6A to 6J are diagrams illustrating a process 600 of fabricating a radio frequency integrated circuit (RFIC) chip, including a metal-insulator-metal (MIM) capacitor, a thin film resistor (TFR) device structure, and an inductor, according to aspects of the present disclosure. FIGS. 6A to 6J may use similar reference numbers to the reference numbers of the RFIC chip 450, as shown in FIG. 4B. FIG. 6A illustrates step 1 of the process 600, in which a high resistivity silicon (HRS) substrate 402 is prepared for fabrication. The substrate 402 may be composed of silicon (Si), HRS, glass, gallium arsenide (GaAs), alumina, silicon carbide (SiC), or other like substrate material.

FIG. 6B is a diagram illustrating step 2 of the process 600, in which an oxide layer 404 is deposited on a surface of the substrate 402. The oxide layer 404 may be composed of a tetraethyl orthosilicate (TEOS) oxide material or other like oxide material. The M1 metallization material may be composed of alumina (Al), lightly copper doped aluminum (AlCu), or other like conductive material.

FIG. 6C is a diagram illustrating step 3 of the process 600, in which an M1 metallization layer 602 is deposited on the oxide layer 404 on the surface of the substrate 402. The M1 metallization layer 602 may be deposited on the oxide layer 404 using a physical vapor deposition (PVD) process.

Figure 6D:
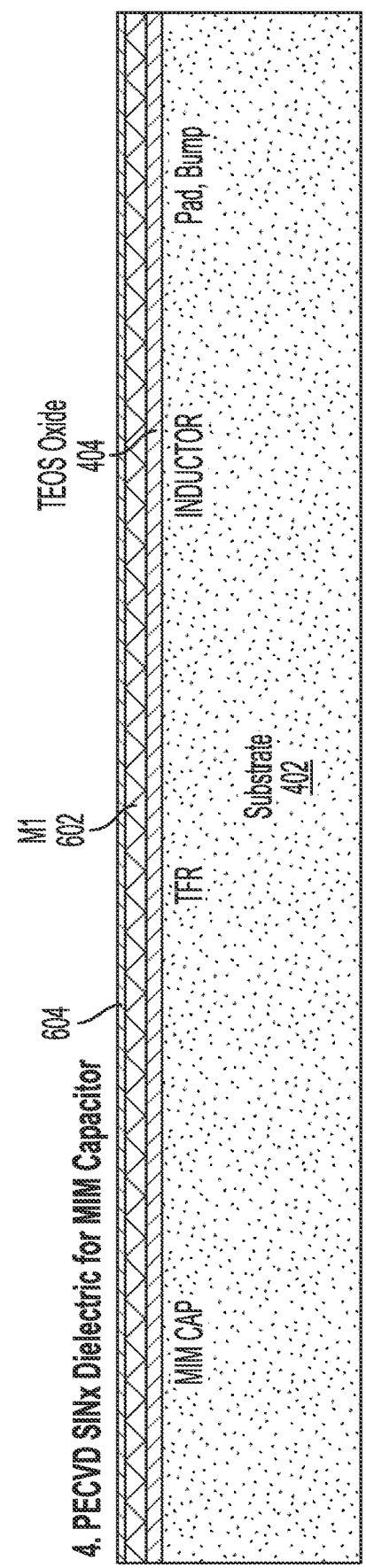

FIG. 6D is a diagram illustrating step 4 of the process 600, in which a dielectric layer 604 is deposited on a surface of the M1 metallization layer 602. In this example, the dielectric layer 604 is composed of silicon nitride (SiN) and deposited on the surface of the M1 metallization layer 602 using a plasma-enhanced chemical vapor deposition (PECVD) process.

Figure 6E:
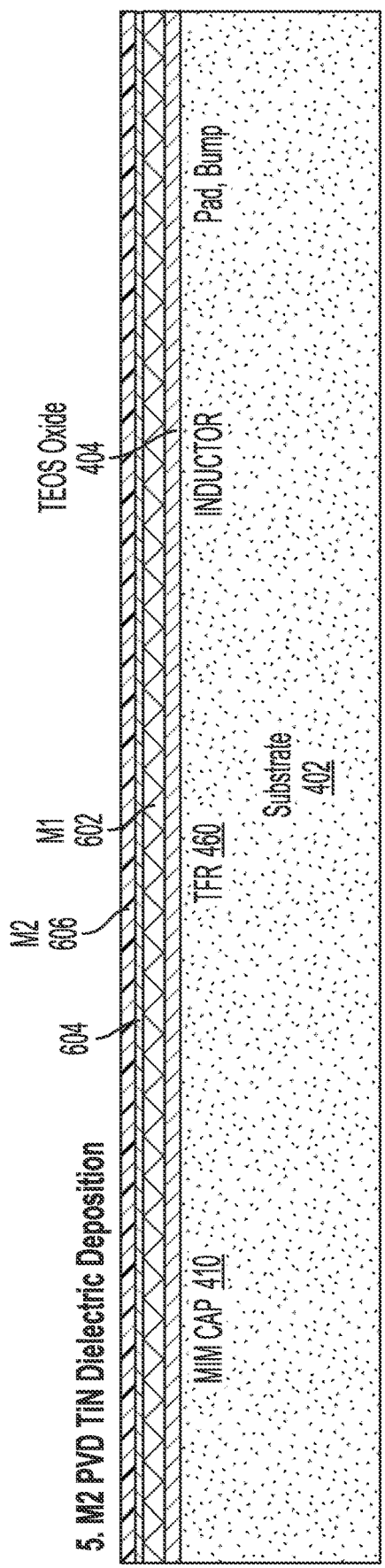

FIG. 6E is a diagram illustrating step 5 of the process 600, in which an M2 metallization layer 606 is deposited on a surface of the dielectric layer 604. In this example, deposition of the M2 metallization layer 606 on the surface of the dielectric layer 604 is performed using a physical vapor deposition (PVD) process. In some aspects of the present disclosure, the M2 metallization layer 606 provides a second plate of the MIM capacitor 410 and a TFR layer of the TFR device structure 460, for example, as shown in FIG. 4B.

Figure 6F:
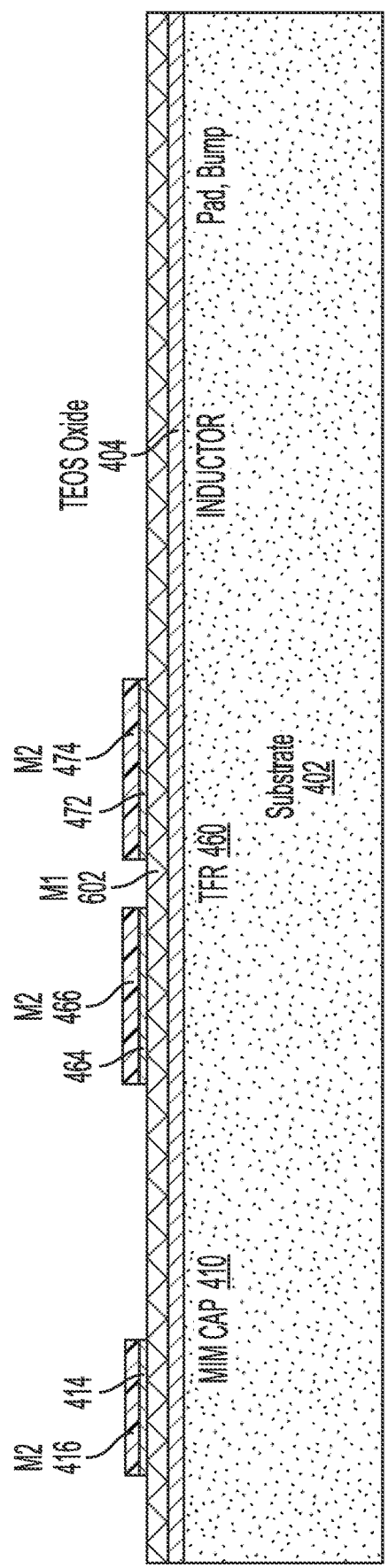

FIG. 6F is a diagram illustrating step 6 of the process 600, in which the dielectric layer 604 and the M2 metallization layer 606 are subjected to a patterning and etching process to expose portions of the M1 metallization layer 602. Application of the patterning and etching process to the dielectric layer 604 and the M2 metallization layer 606 forms the MIM insulator layer 414 and the second plate 416 of the MIM capacitor 410. In addition, application of the patterning and etching process to the dielectric layer 604 and the M2 metallization layer 606 forms the first portion 466 of the M2 metallization layer 606 on the first portion 464 of the dielectric layer 604 and a second portion 474 of the M2 metallization layer 606 on the second portion 472 of the dielectric layer 604. In some aspects of the present disclosure, the first portion 464 and the second portion 474 of the M2 metallization layer 606 are split to provide expected isolation specified by the TFR device structure 460, for example, as shown in FIG. 4B.

Figure 6G:
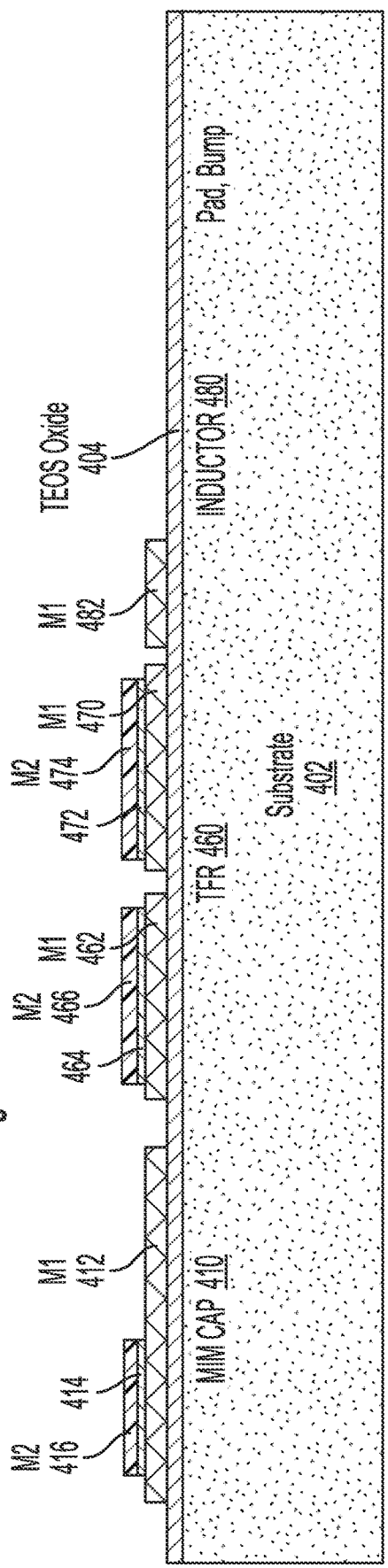

FIG. 6G is a diagram illustrating step 7 of the process 600, in which the M1 metallization layer 602 is subjected to a patterning and etching process to expose portions of the oxide layer 404. Application of the patterning and etching process to the M1 metallization layer 602 forms the first plate 412 of the MIM capacitor 410. In addition, application of the patterning and etching process to the M1 metallization layer 602 forms the first portion 462 and the second portion 470 of the M1 metallization layer 602. Application of the patterning and etching process to the M1 metallization layer 602 forms the third portion 482 of the M1 metallization layer 602 to enable formation of an inductor 480. In some aspects of the present disclosure, the first portion 462 and the second portion 470 of the M1 metallization layer 602 are split to provide expected isolation specified by the TFR device structure 460, for example, as shown in FIG. 4B.

Figure 6H:
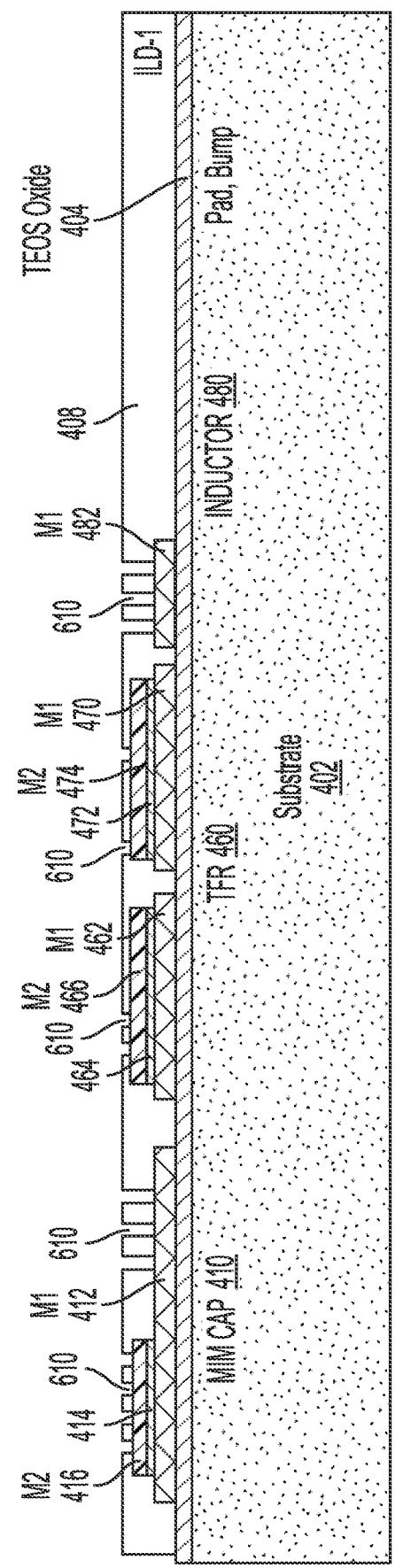

FIG. 6H is a diagram illustrating step 8 of the process 600, in which a first interlayer dielectric (ILD) layer 408 is deposited. Depositing of the first ILD layer 408 may be performed by using a tetraethyl orthosilicate (TEOS) deposition of silicon oxide to form the first ILD layer 408. Alternatively, the first ILD layer 408 is fabricated by using polyimide (PI) to form the first ILD layer A via opening process is then performed to expose portions of the second plate 416 and the first plate 412 of the MIM capacitor 410. In addition, the via opening process is performed to expose portions of the first portion 466 and the second portion 474 of the M2 metallization layer 606 and the third portion 482 of the M1 metallization layer 602 through via openings 610.

Figure 6I:
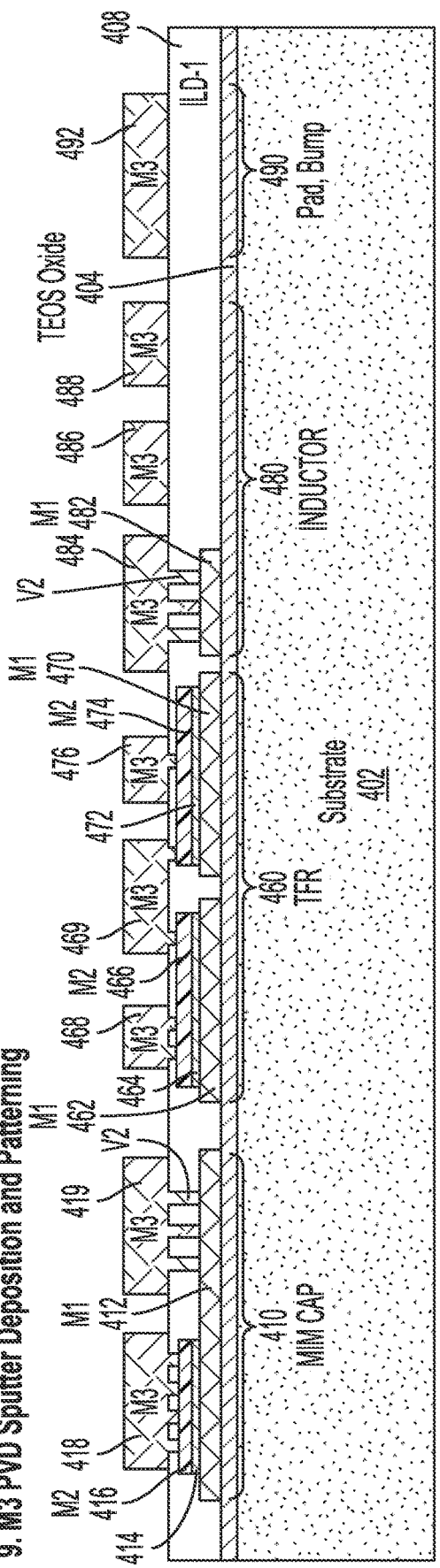

FIG. 6I is a diagram illustrating step 9 of the process 600, in which a physical vapor deposition (PVD) sputtering and patterning process is performed to form portions of an M3 metallization layer and vias V2, according to aspects of the present disclosure. The sputtering and patterning process forms the first portion 418 and the second portion 419 of the M3 metallization layer, which are coupled to the second plate 416 and the first plate 412 through vias V2 in the first ILD layer 408 to complete formation of the MIM capacitor 410. In addition, the sputtering and patterning process forms the second portion 469 of the M3 metallization layer, which couples the first portion 466 to the second portion 474 of the M2 metallization layer. The first portion 468 and the third portion 476 of the M3 metallization layer are formed and coupled to the first portion 466 and the second portion 474 of the M2 metallization layer through vias V2 to complete formation of the TFR device structure 460. In addition, various portions (e.g., 484, 486, 488, and 492) of the M3 metallization layer for the inductor 480 and a pad 490 are formed. The M1 metallization material may be composed of alumina (Al), lightly copper doped aluminum (AlCu), or other like conductive material.

Figure 6J:
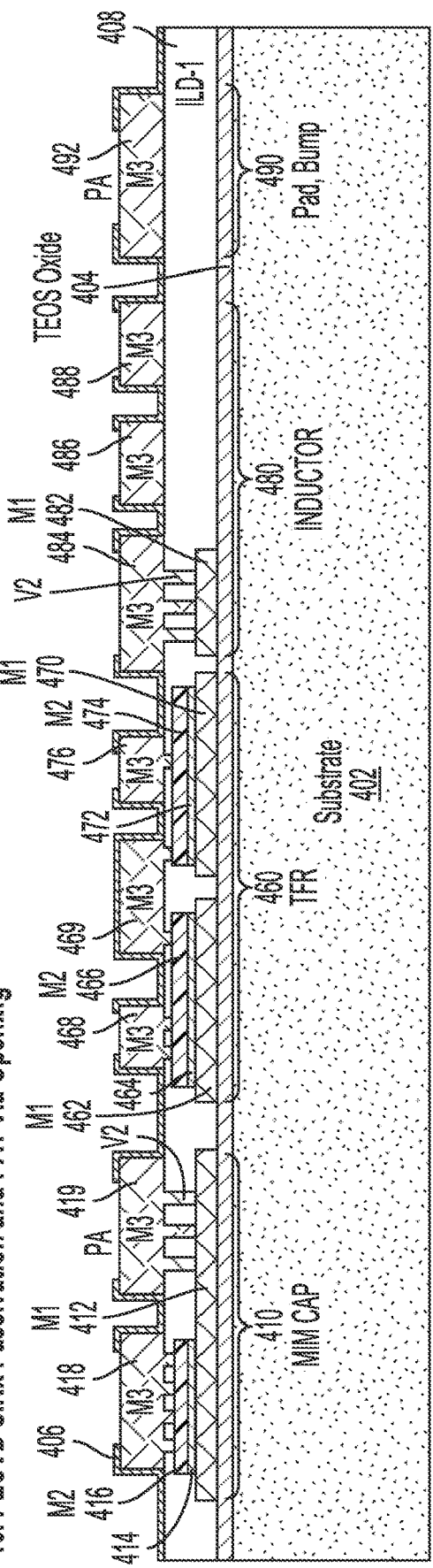

FIG. 6J is a diagram illustrating step 10 of the process 600, in which a plasma-enhanced chemical vapor deposition (PECVD) of a passivation layer 406 and a via opening process are performed on the M3 metallization layer, according to aspects of the present disclosure. Portions of the passivation layer 406 (e.g., silicon nitride (SiNx) silicon oxide (SiOx), etc.) are etched to expose certain portions (e.g., 418, 419, 468, 476, 484, 486, 488, and 492) of the M3 metallization layer. A process for fabrication of an RFIC chip, including a MIM capacitor, a TFR device structure, and an inductor is shown, for example, in FIG. 7.

Figure 7:
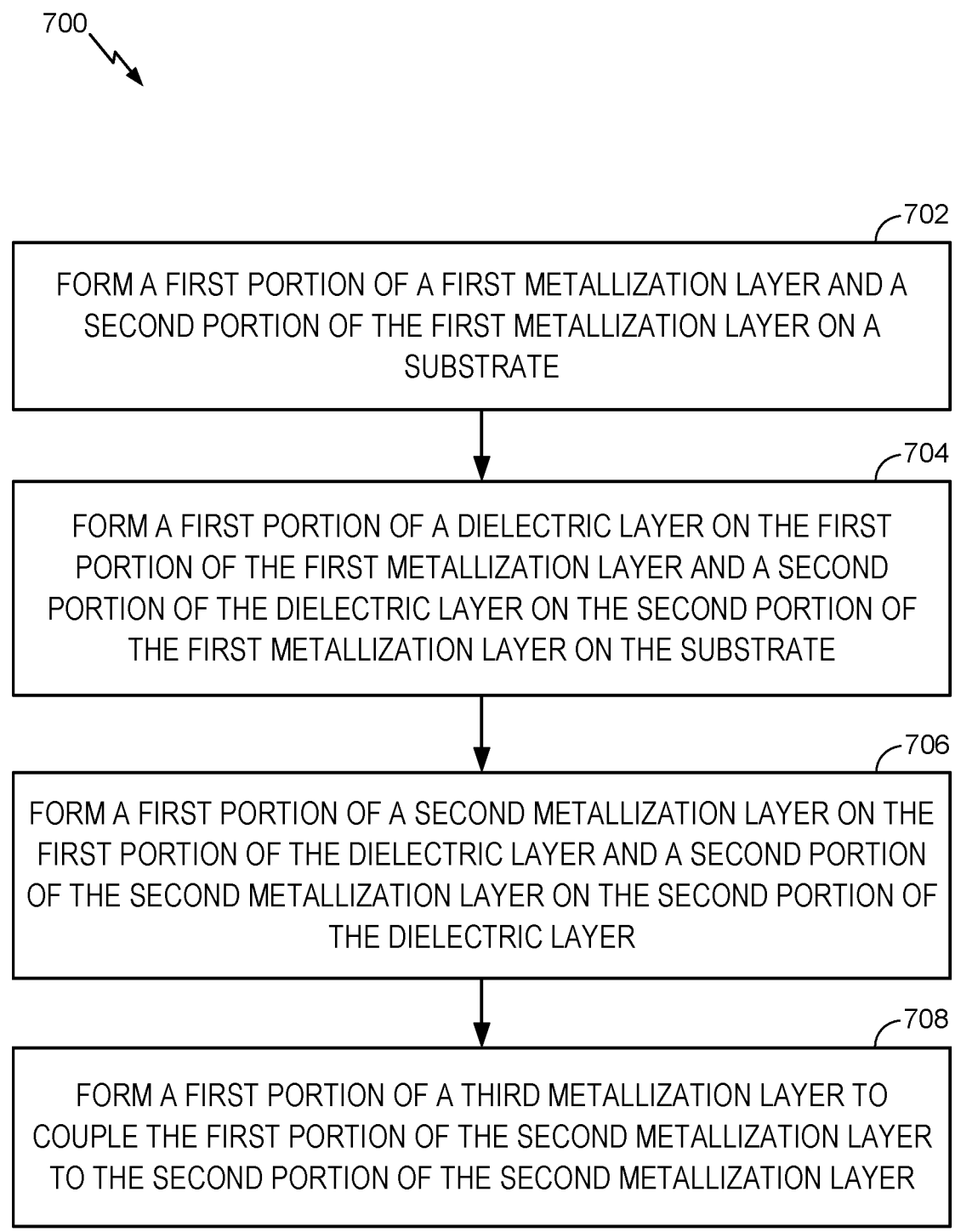
FIG. 7 is a process flow diagram illustrating a method for fabricating a thin film resistor (TFR) device structure, according to aspects of the present disclosure.

FIG. 7 is a process flow diagram illustrating a method for fabricating a thin film resistor (TFR) device structure, according to aspects of the present disclosure. A method 700 begins at block 702, in which a first portion of a first metallization layer and a second portion of the first metallization layer are formed on a substrate. For example, FIG. 6G illustrates the M1 metallization layer 602 subjected to a patterning and etching process to expose portions of the oxide layer 404. Application of the patterning and etching process to the M1 metallization layer 602 forms the first portion 462 and the second portion 470 of the M1 metallization layer 602.

At block 704, a first portion of a dielectric layer is formed on the first portion of the first metallization layer and a second portion of the dielectric layer is formed on the second portion of the first metallization layer on the substrate. As shown in FIG. 6F, the dielectric layer 604 is subjected to a patterning and etching process to expose portions of the M1 metallization layer 602. Application of the patterning and etching process to the dielectric layer 604 forms the first portion 464 of the dielectric layer 604 and the second portion 472 of the dielectric layer 604 to a second portion 470 of the M1 metallization layer 602.

Referring again to FIG. 7, at block 706, a first portion of a second metallization layer is formed on the first portion of the dielectric layer and a second portion of the second metallization layer is formed on the second portion of the dielectric layer. For example, as shown FIG. 6F, the M2 metallization layer 606 is subjected to a patterning and etching process to expose portions of the M1 metallization layer 602. Application of the patterning and etching process to the M2 metallization layer 606 forms the first portion 466 of the M2 metallization layer 606 on the first portion 464 of the dielectric layer 604 and a second portion 474 of the M2 metallization layer 606 on the second portion 472 of the dielectric layer 604. In some aspects of the present disclosure, the first portion 466 and the second portion 474 of the M2 metallization layer are split to provide expected isolation specified by the TFR device structure 460, for example, as shown in FIG. 4B.

At block 708, a first portion of a third metallization layer is formed to couple the first portion of the second metallization layer to the second portion of the second metallization layer. For example, as shown in FIG. 6I, a PVD sputtering and patterning process forms portions of an M3 metallization layer and vias V2, according to aspects of the present disclosure. The sputtering and patterning process forms the second portion 469 of the M3 metallization layer, which couples the first portion 466 to the second portion 474 of the M2 metallization layer 606. In addition, the first portion 468 and the third portion 476 of the M3 metallization layer are formed and coupled to the first portion 466 and the second portion 474 of the M2 metallization layer through vias V2 to complete formation of the TFR device structure 460, as shown in FIG. 4B.

Aspects of the present disclosure are directed to a thin film resistor (TFR) device structure to implement an RF filter, such as a power combiner/divider filter and directional couplers. In some aspects of the present disclosure, the TFR device structure includes a split first metallization layer (e.g., M1). The TFR device structure also includes a dielectric layer portion on the split portions of the M1 metallization layer. In some aspects of the present disclosure, the TFR device structure includes a split M2 metallization layer on the respective portions of the dielectric layer. In some aspects of the present disclosure, the M1 and M2 metallization layers are split to provide expected isolation specified by the TFR device structure. This configuration of the TFR device structure can match an expected radio frequency (RF) response, and also meet the power combiner/divider filter design target specifications.

According to a further aspect of the present disclosure, an integrated circuit (IC) includes a thin film resistor (TFR) device structure. In one configuration, the IC has means for coupling a first portion of a second metallization layer to a second portion of the second metallization layer floated over first and second portions of a first metallization layer. In one configuration, the coupling means may be the second portion 469 of the M3 metallization layer that couples the first portion 466 of the M2 metallization layer to the second portion 474 of the M2 metallization layer, as shown in FIG. 4B. In another aspect, the aforementioned means may be any structure or any material configured to perform the functions recited by the aforementioned means.

Figure 8:
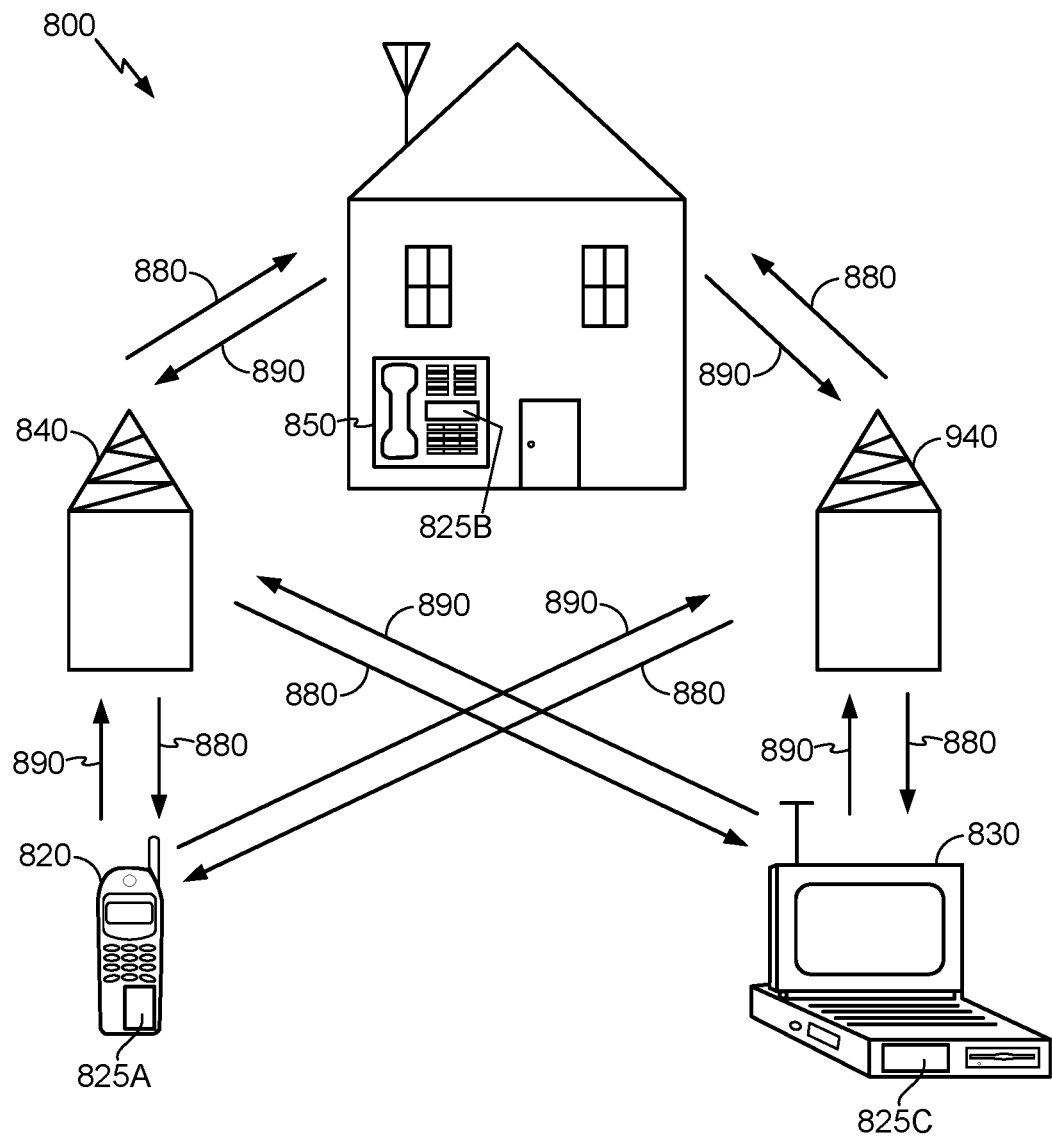
FIG. 8 is a block diagram showing an exemplary wireless communications system in which a configuration of the present disclosure may be advantageously employed.

FIG. 8 is a block diagram showing an exemplary wireless communications system 800 in which an aspect of the disclosure may be advantageously employed. For purposes of illustration, FIG. 8 shows three remote units 820, 830, and 850 and two base stations 840. It will be recognized that wireless communications systems may have many more remote units and base stations. Remote units 820, 830, and 850 include integrated circuit (IC) devices 825A, 825C, and 825B that include the disclosed TFR device structure. It will be recognized that other devices may also include the disclosed TFR device structure, such as the base stations, switching devices, and network equipment. FIG. 8 shows forward link signals 880 from the base station 840 to the remote units 820, 830, and 850, and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 8 illustrates remote units according to the aspects of the present disclosure, the present disclosure is not limited to these exemplary illustrated units. Aspects of the present disclosure may be suitably employed in many devices, which include the disclosed TFR device structure.

Figure 9:
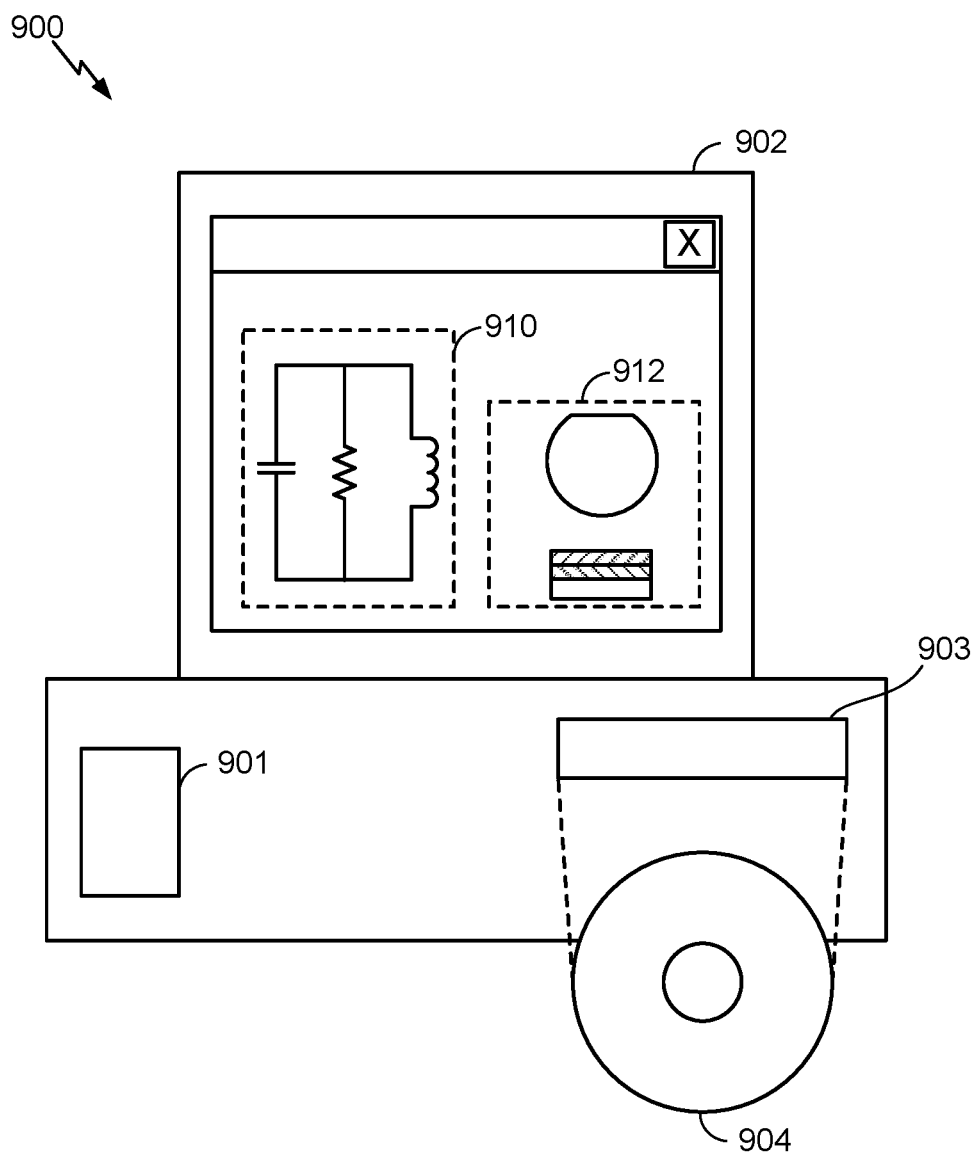
FIG. 9 is a block diagram illustrating a design workstation used for circuit, layout, and logic design of a semiconductor component according to one configuration.

FIG. 9 is a block diagram illustrating a design workstation used for circuit, layout, and logic design of a semiconductor component, such as the TFR device structure disclosed above. A design workstation 900 includes a hard disk 901 containing operating system software, support files, and design software such as Cadence or OrCAD. The design workstation 900 also includes a display 902 to facilitate design of a circuit 910 or a radio frequency (RF) component 912 such as a cross-type capacitor. A storage medium 904 is provided for tangibly storing the design of the circuit 910 or the RF component 912 (e.g., the TFR device structure). The design of the circuit 910 or the RF component 912 may be stored on the storage medium 904 in a file format such as GDSII or GERBER. The storage medium 904 may be a compact disc read-only memory (CD-ROM), digital versatile disc (DVD), hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the radio frequency (RF) component 912 by decreasing the number of processes for designing semiconductor wafers.

Implementation examples are described in the following numbered clauses:

1. An integrated circuit (IC), comprising:
    a substrate; and
    a thin film resistor (TFR) device structure comprising:
        a first portion of a first metallization layer and a second portion of the first metallization layer on the substrate;
        a first portion of a dielectric layer on the first portion of the first metallization layer and a second portion of the dielectric layer on the second portion of the first metallization layer;
        a first portion of a second metallization layer on the first portion of the dielectric layer and a second portion of the second metallization layer on the second portion of the dielectric layer; and
        a first portion of a third metallization layer coupling the first portion of the second metallization layer to the second portion of the second metallization layer.

2. The IC of clause 1, further comprising:
    a first interlayer dielectric (ILD) layer on a surface of the substrate and the first portion and the second portion of the second metallization layer;
    a first plurality of vias extending through the first ILD layer to the first portion of the second metallization layer;
    a second plurality of vias extending through the first ILD layer to the second portion of the second metallization layer;
    a second portion of the third metallization layer on the first ILD layer and coupled to the first portion of the second metallization layer through the first plurality of vias; and
    a third portion of the third metallization layer on the first ILD layer and coupled to the second portion of the second metallization layer through the second plurality of vias.

3. The IC of any of clauses 1 or 2, further comprising:
    a metal-insulator-metal (MIM) capacitor comprising:
        a first plate composed of the first metallization layer on a surface of the substrate;

a MIM insulator layer on the first plate; and
a second plate on the MIM insulator layer.

4. The IC of clause 3, further comprising:
a first interlayer dielectric (ILD) layer on the surface of the substrate and the first plate and the second plate of the MIM capacitor;
a first plurality of vias extending through the first ILD layer to the second plate of the MIM capacitor;
a second plurality of vias extending through the first ILD layer to the first plate of the MIM capacitor;
a second portion of the third metallization layer on the first ILD layer and coupled to the second plate of the MIM capacitor through the first plurality of vias; and
a third portion of the third metallization layer on the first ILD layer and coupled to the first plate of the MIM capacitor through the second plurality of vias.

5. The IC of any of clauses 1-4, further comprising an inductor, the inductor comprising:
a third portion of the first metallization layer on a surface of the substrate;
a first interlayer dielectric (ILD) layer on the surface of the substrate and the third portion of the first metallization layer;
a plurality of vias extending through the first ILD layer to the third portion of the first metallization layer; and
a second portion of the third metallization layer on the first ILD layer and coupled to the third portion of the first metallization layer through the plurality of vias.

6. The IC of any of clauses 1-5, further comprising an oxide layer directly on a surface of the substrate.

7. The IC of any of clauses 1-6, in which the substrate comprises a high resistivity silicon (HRS) substrate.

8. The IC of any of clauses 1-7, in which the IC is integrated in an integrated passive device (IPD).

9. The IC of clause 8, in which the IPD is integrated in a radio frequency (RF) filter.

10. The IC of clause 9, in which the RF filter is integrated in a radio frequency front-end (RFFE) module.

11. A method for fabricating a thin film resistor (TFR) device structure, comprising:
forming a first portion of a first metallization layer and a second portion of the first metallization layer on a substrate;
forming a first portion of a dielectric layer on the first portion of the first metallization layer and a second portion of the dielectric layer on the second portion of the first metallization layer;
forming a first portion of a second metallization layer on the first portion of the dielectric layer and a second portion of the second metallization layer on the second portion of the dielectric layer; and
forming a first portion of a third metallization layer to couple the first portion of the second metallization layer to the second portion of the second metallization layer.

12. The method of clause 11, further comprising:
depositing a first interlayer dielectric (ILD) layer on a surface of the substrate and the first portion and the second portion of the second metallization layer;
forming a first plurality of vias extending through the first ILD layer to the first portion of the second metallization layer;
forming a second plurality of vias extending through the first ILD layer to the second portion of the second metallization layer;
forming a second portion of the third metallization layer on the first ILD layer and coupled to the first portion of the second metallization layer through the first plurality of vias; and
forming a third portion of the third metallization layer on the first ILD layer and coupled to the second portion of the second metallization layer through the second plurality of vias.

13. The method of any of clauses 11 or 12, further comprising:
forming a first plate composed of the first metallization layer on a surface of the substrate;
forming a metal-insulator-metal (MIM) insulator layer on the first plate; and
forming a second plate on the MIM insulator layer.

14. The method of clause 13, further comprising:
depositing a first interlayer dielectric (ILD) layer on the surface of the substrate and the first plate and the second plate;
forming a first plurality of vias extending through the first ILD layer to the second plate;
forming a second plurality of vias extending through the first ILD layer to the first plate;
forming a second portion of the third metallization layer on the first ILD layer and coupled to the second plate through the first plurality of vias; and
forming a third portion of the third metallization layer on the first ILD layer and coupled to the first plate through the second plurality of vias.

15. The method of any of clauses 11-14, further comprising:
forming a third portion of the first metallization layer on a surface of the substrate;
depositing a first interlayer dielectric (ILD) layer on the surface of the substrate and the third portion of the first metallization layer;
forming a plurality of vias extending through the first ILD layer to the third portion of the first metallization layer; and
forming a second portion of the third metallization layer on the first ILD layer and coupled to the third portion of the first metallization layer through the plurality of vias.

16. The method of any of clauses 11-15, further comprising depositing an oxide layer directly on a surface of the substrate.

17. The method of any of clauses 11-16, in which the substrate comprises a high resistivity silicon (HRS) substrate.

18. The method of any of clauses 11-17, further comprising integrating the thin film resistor (TFR) device structure in an integrated passive device (IPD).

19. The method of clause 18, further comprising integrating the IPD in a radio frequency (RF) filter.

20. The method of clause 19, further comprising integrating the RF filter in a radio frequency front-end (RFFE) module.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include random access memory (RAM), read-only memory (ROM), electrically erasable programmable read-only memory (EEPROM), compact disc read-only memory (CD-ROM) or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function, or achieve substantially the same result as the corresponding configurations described herein, may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in random access memory (RAM), flash memory, read-only memory (ROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include random access memory (RAM), read-only memory (ROM), electrically erasable programmable read-only memory (EEPROM), compact disc read-only memory (CD-ROM) or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

The previous description of the present disclosure is provided to enable any person skilled in the art to make or use the disclosure. Various modifications to the present disclosure will be readily apparent to those skilled in the art, and the generic principles defined herein may be applied to other variations without departing from the spirit or scope of the disclosure. Thus, the present disclosure is not intended to be limited to the examples and designs described herein but is to be accorded the widest scope consistent with the principles and novel features disclosed herein.

What is claimed is:

1. An integrated circuit (IC), comprising:
   a substrate; and
   a thin film resistor (TFR) device structure comprising:
      a first portion of a first metallization layer and a second portion of the first metallization layer on the substrate;
      a first portion of a dielectric layer on the first portion of the first metallization layer and a second portion of the dielectric layer on the second portion of the first metallization layer;
      a first portion of a second metallization layer on the first portion of the dielectric layer and a second portion of the second metallization layer on the second portion of the dielectric layer; and
      a first portion of a third metallization layer coupling the first portion of the second metallization layer to the second portion of the second metallization layer.

2. The IC of claim 1, further comprising:
   a first interlayer dielectric (ILD) layer on a surface of the substrate and the first portion and the second portion of the second metallization layer;
   a first plurality of vias extending through the first ILD layer to the first portion of the second metallization layer;
   a second plurality of vias extending through the first ILD layer to the second portion of the second metallization layer;
   a second portion of the third metallization layer on the first ILD layer and coupled to the first portion of the second metallization layer through the first plurality of vias; and
   a third portion of the third metallization layer on the first ILD layer and coupled to the second portion of the second metallization layer through the second plurality of vias.

3. The IC of claim 1, further comprising:
   a metal-insulator-metal (MIM) capacitor comprising:
      a first plate composed of the first metallization layer on a surface of the substrate;
      a MIM insulator layer on the first plate; and
      a second plate on the MIM insulator layer.

4. The IC of claim 3, further comprising:
   a first interlayer dielectric (ILD) layer on the surface of the substrate and the first plate and the second plate of the MIM capacitor;
   a first plurality of vias extending through the first ILD layer to the second plate of the MIM capacitor;
   a second plurality of vias extending through the first ILD layer to the first plate of the MIM capacitor;
   a second portion of the third metallization layer on the first ILD layer and coupled to the second plate of the MIM capacitor through the first plurality of vias; and
   a third portion of the third metallization layer on the first ILD layer and coupled to the first plate of the MIM capacitor through the second plurality of vias.

5. The IC of claim 1, further comprising an inductor, the inductor comprising:
   a third portion of the first metallization layer on a surface of the substrate;
   a first interlayer dielectric (ILD) layer on the surface of the substrate and the third portion of the first metallization layer;
   a plurality of vias extending through the first ILD layer to the third portion of the first metallization layer; and
   a second portion of the third metallization layer on the first ILD layer and coupled to the third portion of the first metallization layer through the plurality of vias.

6. The IC of claim 1, further comprising an oxide layer directly on a surface of the substrate.

7. The IC of claim 1, in which the substrate comprises a high resistivity silicon (HRS) substrate.

8. The IC of claim 1, in which the IC is integrated in an integrated passive device (IPD).

9. The IC of claim 8, in which the IPD is integrated in a radio frequency (RF) filter.

10. The IC of claim 9, in which the RF filter is integrated in a radio frequency front-end (RFFE) module.

11. A method for fabricating a thin film resistor (TFR) device structure, comprising:
    forming a first portion of a first metallization layer and a second portion of the first metallization layer on a substrate;
    forming a first portion of a dielectric layer on the first portion of the first metallization layer and a second portion of the dielectric layer on the second portion of the first metallization layer;
    forming a first portion of a second metallization layer on the first portion of the dielectric layer and a second portion of the second metallization layer on the second portion of the dielectric layer; and
    forming a first portion of a third metallization layer to couple the first portion of the second metallization layer to the second portion of the second metallization layer.

12. The method of claim 11, further comprising:
    depositing a first interlayer dielectric (ILD) layer on a surface of the substrate and the first portion and the second portion of the second metallization layer;
    forming a first plurality of vias extending through the first ILD layer to the first portion of the second metallization layer;
    forming a second plurality of vias extending through the first ILD layer to the second portion of the second metallization layer;
    forming a second portion of the third metallization layer on the first ILD layer and coupled to the first portion of the second metallization layer through the first plurality of vias; and
    forming a third portion of the third metallization layer on the first ILD layer and coupled to the second portion of the second metallization layer through the second plurality of vias.

13. The method of claim 11, further comprising:
    forming a first plate composed of the first metallization layer on a surface of the substrate;

forming a metal-insulator-metal (MIM) insulator layer on the first plate; and forming a second plate on the MIM insulator layer.

14. The method of claim 13, further comprising:

depositing a first interlayer dielectric (ILD) layer on the surface of the substrate and the first plate and the second plate;

forming a first plurality of vias extending through the first ILD layer to the second plate;

forming a second plurality of vias extending through the first ILD layer to the first plate;

forming a second portion of the third metallization layer on the first ILD layer and coupled to the second plate through the first plurality of vias; and forming a third portion of the third metallization layer on the first ILD layer and coupled to the first plate through the second plurality of vias.

15. The method of claim 11, further comprising:

forming a third portion of the first metallization layer on a surface of the substrate;

depositing a first interlayer dielectric (ILD) layer on the surface of the substrate and the third portion of the first metallization layer;

forming a plurality of vias extending through the first ILD layer to the third portion of the first metallization layer; and forming a second portion of the third metallization layer on the first ILD layer and coupled to the third portion of the first metallization layer through the plurality of vias.

16. The method of claim 11, further comprising depositing an oxide layer directly on a surface of the substrate.

17. The method of claim 11, in which the substrate comprises a high resistivity silicon (HRS) substrate.

18. The method of claim 11, further comprising integrating the TFR device structure in an integrated passive device (IPD).

19. The method of claim 18, further comprising integrating the IPD in a radio frequency (RF) filter.

20. The method of claim 19, further comprising integrating the RF filter in a radio frequency front-end (RFFE) module.

* * * * *